United States Patent
Lee et al.

(10) Patent No.: US 6,794,270 B2
(45) Date of Patent: Sep. 21, 2004

(54) METHOD FOR SHALLOW TRENCH ISOLATION FABRICATION AND PARTIAL OXIDE LAYER REMOVAL

(75) Inventors: Pei-Ing Lee, Taipei-Hsien (TW); Chang Rong Wu, Taipei (TW); Tzu En Ho, Ilan (TW); Yi-Nan Chen, Taipei (TW); Hsien Wen Su, Pingtung (TW)

(73) Assignee: Nanya Technology Corporation, Taoyuan (TW)

( * ) Notice: Subject to any disclaimer, the term of this patent is extended or adjusted under 35 U.S.C. 154(b) by 35 days.

(21) Appl. No.: 10/394,681

(22) Filed: Mar. 21, 2003

(65) Prior Publication Data

US 2003/0216007 A1 Nov. 20, 2003

(30) Foreign Application Priority Data

May 17, 2002 (TW) ...................................... 91110427 A

(51) Int. Cl.⁷ ........................ H01L 21/76; H01L 21/302; H01L 21/461; H01L 21/31; H01L 21/469
(52) U.S. Cl. ........................ 438/428; 438/424; 438/428; 438/745; 438/748; 438/788; 438/789; 427/583; 427/255.28; 427/595; 257/E21.309; 257/E21.582
(58) Field of Search ................................ 438/428, 424, 438/745, 748, 788, 789; 257/E21.309, E21.582; 427/583, 255.28, 595

(56) References Cited

U.S. PATENT DOCUMENTS

| | | | | |
|---|---|---|---|---|
| 5,403,630 A | * | 4/1995 | Matsui et al. | 427/583 |
| 5,486,234 A | * | 1/1996 | Contolini et al. | 216/91 |
| 5,512,767 A | * | 4/1996 | Noble, Jr. | 257/301 |
| 6,455,394 B1 | * | 9/2002 | Iyer et al. | 438/428 |

* cited by examiner

Primary Examiner—John F. Niebling
Assistant Examiner—Ron Pompey
(74) Attorney, Agent, or Firm—Quintero Law Office

(57) ABSTRACT

A method for forming thoroughly deposited shallow trench isolation. A first oxide layer is formed conformally over the surface of a semiconductor substrate and on a trench thereon with an aspect ratio greater than 3. A liquid etching shield is filled in the trench by spin-spraying to cover the oxide layer in the trench. An etchant is then sprayed over the surface of the semiconductor substrate to remove the uncovered oxide layer and expose the surface of the semiconductor substrate. The density of the etchant is less than that of the liquid etching shield. A second oxide layer is deposited in the trench to form isolation without voids or seams.

14 Claims, 4 Drawing Sheets

US 6,794,270 B2

METHOD FOR SHALLOW TRENCH ISOLATION FABRICATION AND PARTIAL OXIDE LAYER REMOVAL

BACKGROUND OF THE INVENTION

1. Field of the Invention

The present invention relates to semiconductor integrated circuit fabrication, and in particular to the fabrication of void-free shallow trench isolation by spin spray etching.

2. Description of the Related Art

For semiconductor fabrication, active regions on a semiconductor substrate are defined by isolation structures, such as shallow trench isolation (STI) or recessed silicon dioxide isolation (ROI), used broadly in modern semiconductor fabrication. A conventional formation of a shallow trench isolation structure forms a trench on a predetermined region of a semiconductor substrate, filling the trench with insulating materials by chemical vapor deposition (CVD), and planarizing the surface of the semiconductor substrate by chemical mechanical polishing (CMP) to form shallow trench isolation with flat surface.

However, in highly developed IC design, the space between shallow trench isolation structures isolating active areas is narrowed to 0.11 $\mu$m or even less. Meanwhile, the aspect ratio (depth/width) of the shallow trench is above 3 or 4. Even if an HDPCVD with good filling capability is employed, voids or seams persist in the STI regions and one-step coverage is hard to achieve. When conductive materials are deposited in subsequent processes, these defects cause short circuits between devices, thus reducing the lifetime of the device.

SUMMARY OF THE INVENTION

The object of the present invention is to provide a method of fabricating a high aspect ratio shallow trench isolation structure to prevent voids or seams in a STI structure thereby avoiding electrical defects.

To achieve the above-mentioned object, the present invention provides a method for shallow trench isolation fabrication. In an embodiment, a semiconductor substrate with a shallow trench thereon, i.e. with aspect ratio is 3 or above, is provided. An oxide layer is formed conformally on the trench and over the surface of the semiconductor substrate. The shallow trench is then filled with a liquid etching shield by spin-spraying. The uncovered oxide layer is subsequently removed by applying an etchant over the surface of the semiconductor substrate by spin-spraying, such that the oxide layer covered with the liquid etching shield is intact. To achieve the above process, the density of the etchant is less than that of the liquid etching shield.

In addition, after removing the upper portion of the oxide layer with the etchant, the etchant and the liquid etching shield are washed away with deionized water. Another oxide layer is then deposited on the oxide layer in the trench after the semiconductor substrate is thoroughly dried.

Accordingly, a shallow trench with thoroughly deposited isolation material can be formed without voids or seams in the trench on the semiconductor substrate, thereby improving the reliability of the semiconductor device.

Preferably, the spinning speed of filling the liquid etching shield is about 1000 to 1500 rpm and the spinning speed of spraying the etchant is between 1500 to 2000 rpm.

According to the present invention, the preferred liquid etching shield is a surfactant, such as polyacrylic acid or low cost chemical with high density, low viscosity and low toxicity, such as phosphoric acid, acetic acid or ethylene glycol.

According to the present invention, the preferred etchant is diluted hydrofluoric acid or buffered oxide etchant (BOE), for which the density is less than the liquid etching shield and insoluble with each other. More specifically, the density of the liquid etching shield at room temperature should be about 1.1 to 2.0 g/cm$^3$ with density of the etchant about 1 g/cm$^3$.

In addition, the operating temperature is about 25 to 40° C., which can be achieved by elevating the temperature of the semiconductor substrate.

Preferably, the oxide layer is silicon oxide formed by high density plasma chemical vapor deposition (HDPCVD).

Preferably, the viscosity of the liquid etching shield should be lower than that of the etchant.

Moreover, the present invention further provides a method for removing partial oxide layer from a semiconductor substrate with a trench thereon, comprising subsequent steps. An oxide layer is formed on the trench and over the surface of the semiconductor substrate. The trench is filled with a liquid etching shield by spin-spraying. The upper portion of the oxide layer is etched subsequently by spin-spraying an etchant over the surface of the semiconductor substrate, such that the oxide layer covered with the liquid etching shield remains intact, wherein the density of the etchant is less than that of the liquid etching shield.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
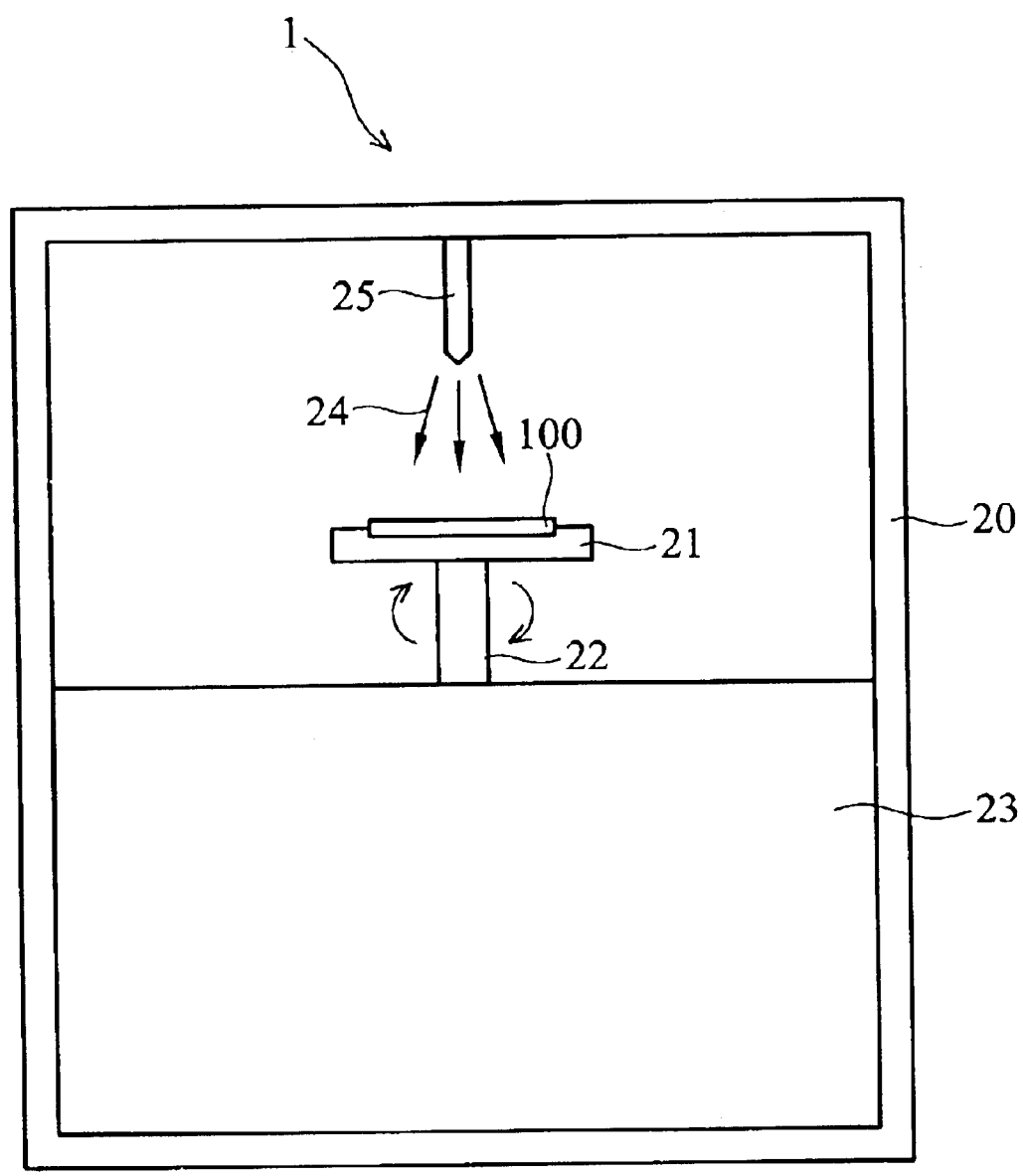
FIG. 1 is a schematic drawing showing a device for spin-spraying etching according to one embodiment of the present invention.

Details of the present invention are further exemplified referring to the device shown in FIG. 1 and the process flow of STI fabrication shown in FIGS. 2 to 6.

FIG. 1 shows a spin-spraying etching tool 1 used in one embodiment of the present invention, comprising an enclosure 20 of the spin-spraying etching tool, a nozzle assembly 25 connecting an etchant supplier (not shown) to provide an etchant 24 or liquid etching shield, and a wafer plate 21 connecting a spin controllable mechanism 23 with a spin shaft 22 to bear a semiconductor wafer or a semiconductor substrate 100.

FIGS. 2 to 6 illustrate a method flow for fabricating a shallow trench isolation structure according to one embodiment of the present invention.

Figure 2:
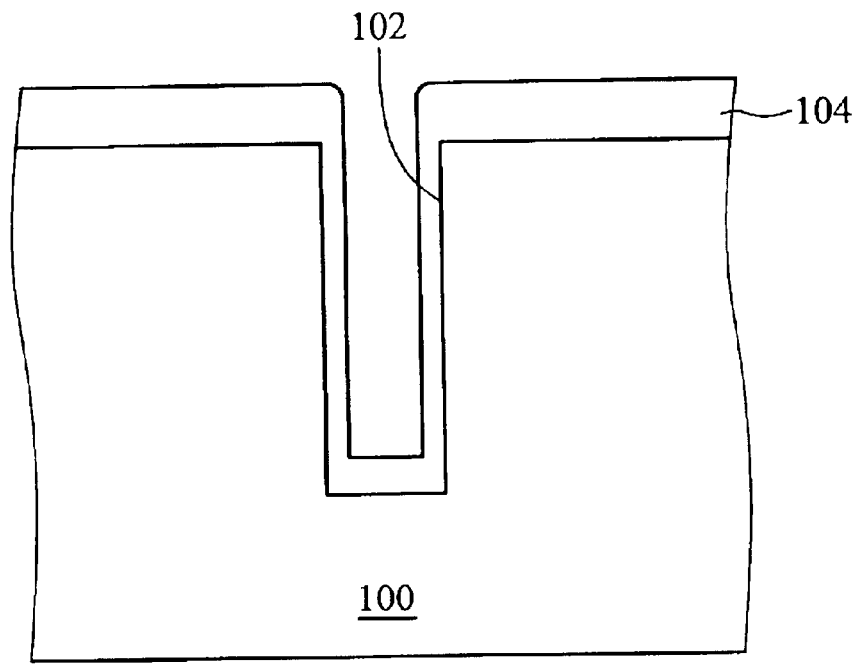
FIGS. 2 to 6 are cross-sections of one embodiment in accordance with the present invention for fabricating a shallow trench isolation structure.

In FIG. 2, a patterned hard mask (not shown), such as nitride, is formed on a predetermined region of a semiconductor substrate 100. The semiconductor substrate 100 is then etched with the hard mask as an etching mask to form a shallow trench 102 with an aspect ratio of 3 to 6. An oxide layer 104 is formed conformally on the sidewall and bottom portion of the trench 102 and over the surface of the semiconductor substrate by high density plasma chemical vapor deposition (HDPCVD).

Figure 3:
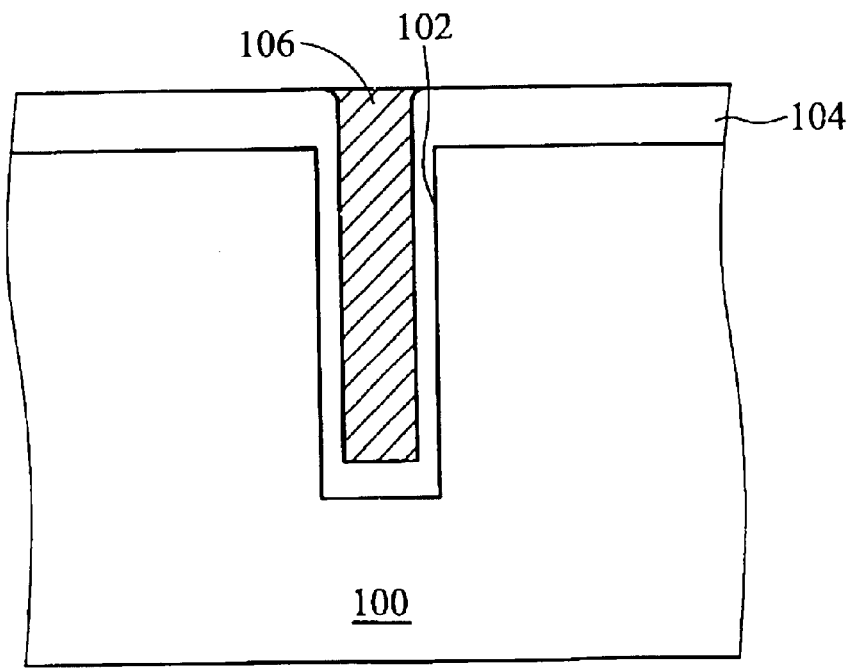

The semiconductor substrate 100 is placed on the wafer plate 21 as shown in FIG. 1 and the nozzle assembly 25 of the spin-spraying etching tool 1 sprays liquid etching shield 106, filling the trench 102. The spinning speed is manipulated between 1000 to 1500 rpm by the spin shaft 22, controlled by the spin controllable mechanism 23. The liquid etching shield 106 is filled into the trench 102 as shown in FIG. 3 to protect the oxide layer 104 from etching in subsequent steps. The preferred liquid etching shield 106 is insoluble organic solvent with a density between 1.1 and 2.0. More specifically, the liquid etching shield 106 can be 1, 1-dichloroethane or 1, 2-dichloroethane. More preferably, the operating temperature is kept between 25 and 40° C. to improve the filling of the liquid etching shield 106.

Figure 4:
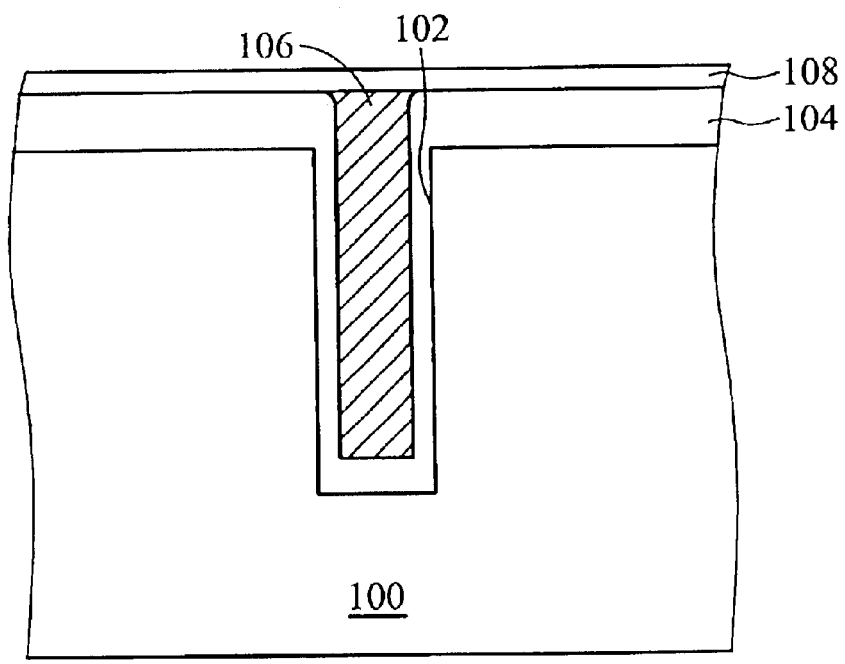
Figure 5:
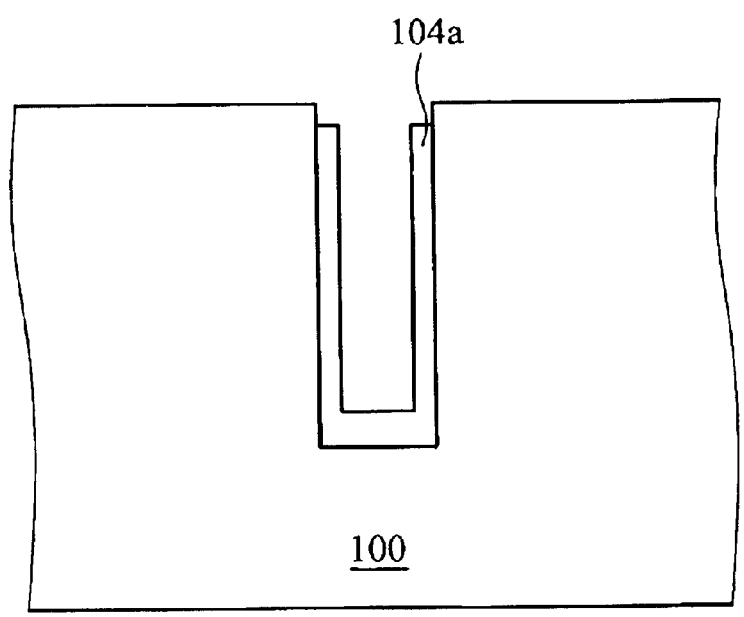

The surface of the semiconductor substrate is further covered with an etchant 108 by spin-spraying on the spin-spraying etching tool 1, as FIG. 4 shows. Preferably, the etchant 108 is diluted hydrofluoric acid or buffered oxide etchant (BOE) with a density about 1 at room temperature (25° C.). Since the density of the etchant 108 is less than that of the liquid etching shield 106, the etchant 108 floats over the liquid etching shield 106. The preferred spinning speed of the wafer plate 21 is about 1500 to 2000 rpm to etch the upper portion of the oxide layer 104 and thus expose the surface of the semiconductor 100 and leave the oxide layer 104a on the sidewall and bottom of the trench 102 intact. The etchant 108, the liquid etching shield, and residue is then washed away with deionized water. After drying, the semiconductor substrate 100 with an oxide layer 104a in the trench 102 remains, as shown as FIG. 5.

Figure 6:
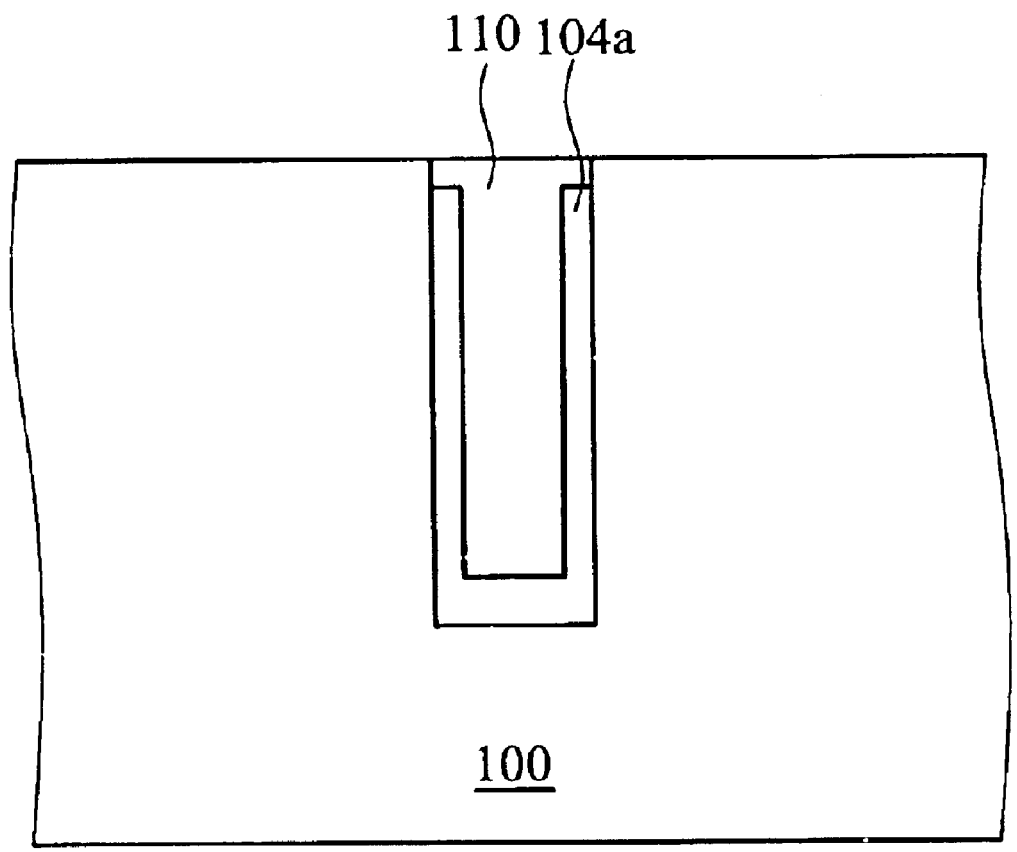

The trench 102 on the semiconductor substrate 100 is filled with deposited oxide layer 110 on the oxide layer 104a by HDPCVD. Preferably, the deposited oxide layer 110 is deposited by two HDPCVD treatments and the surface of the semiconductor substrate 100 is planarized by chemical mechanical polishing or spin-spraying etching on the spin-spraying etching tool 1, as shown in FIG. 6. Thus, thoroughly deposited shallow trench isolation for active areas on the semiconductor substrate 100 is formed accordingly.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for shallow trench isolation fabrication, comprising:

providing a semiconductor substrate with a trench therein;

forming an oxide layer in the trench and the surface of the semiconductor substrate conformally;

filling the trench with a liquid etching shield with a first density by spin spraying; and spraying an etchant with a second density over the surface of the semiconductor substrate by spin-spraying to remove a portion of the oxide layer, exposing an upper surface of the semiconductor substrate but retaining the oxide layer on the bottom of the trench;

wherein the second density of the etchant is less than the first density of the liquid etching shield.

2. The method as claimed in claim 1, further comprising, after removing the oxide layer with the etchant, the following steps:

washing away the etchant and the liquid etching shield with deionized water;

drying the semiconductor substrate; and forming an oxide layer over the oxide layer on the trench.

3. The method as claimed in claim 1, wherein the spinning speed to fill the liquid etching shield is about 1000 to 1500 rpm.

4. The method as claimed in claim 1, the spinning speed to fill the etchant is about 1500 to 2000 rpm.

5. The method as claimed in claim 1, wherein the liquid etching shield is polyacylic acid.

6. The method as claimed in claim 1, wherein etchant is diluted hydrofluoric acid or buffered oxide etchant.

7. The method as claimed in claim 1, wherein the aspect ratio of the trench is about 3 to 6.

8. The method as claimed in claim 1, wherein the first density of the liquid etching shield at room temperature is about 1.1 to 2.0 and the second density of the etchant at room temperature is about 1.

9. The method as claimed in claim 1, wherein filling of the liquid etching shield takes place at about 25 to 40° C.

10. The method as claimed in claim 1, wherein the oxide layer is silicon dioxide formed by high density plasma chemical vapor deposition.

11. The method as claimed in claim 1, wherein the viscosity of the liquid etching shield is less than the viscosity of the etchant.

12. The method as claimed in claim 1, wherein the liquid etching shield is phosphoric acid, acetic acid or ethylene glycol.

13. A method of partial oxide layer removal from a semiconductor substrate with a trench therein, comprising:

forming an oxide layer in the trench and the surface of the semiconductor substrate conformally;

filling the trench by spin spraying with a liquid etching shield with a first density; and spraying an etchant with a second density over the surface of the semiconductor substrate by spin-spraying to remove a portion of the oxide layer, exposing an upper surface of the semiconductor substrate but retaining the oxide layer on the bottom of the trench;

wherein the second density of the etchant is less than the first density of the liquid etching shield.

14. The method as claimed in claim 13, further comprising, after removing the oxide layer with the etchant, washing away the etchant and the liquid etching shield with deionized water.

* * * * *